US012455503B2

(12) United States Patent
Kuna et al.

(10) Patent No.: US 12,455,503 B2
(45) Date of Patent: Oct. 28, 2025

(54) LITHOGRAPHIC METHOD FOR IMPRINTING THREE-DIMENSIONAL MICROSTRUCTURES HAVING OVERSIZED STRUCTURAL HEIGHTS INTO A CARRIER MATERIAL

(71) Applicant: Joanneum Research Forschungsgesellschaft mbH, Graz (AT)

(72) Inventors: Ladislav Kuna, Puch bei Weiz (AT); Markus Postl, Graz (AT); Barbara Stadlober, Graz (AT)

(73) Assignee: Joanneum Research Forschungsgesellschaft mbH, Graz (AT)

( * ) Notice: Subject to any disclaimer, the term of this patent is extended or adjusted under 35 U.S.C. 154(b) by 160 days.

(21) Appl. No.: 18/566,038

(22) PCT Filed: May 20, 2022

(86) PCT No.: PCT/EP2022/063680
§ 371 (c)(1),
(2) Date: Nov. 30, 2023

(87) PCT Pub. No.: WO2022/253591
PCT Pub. Date: Dec. 8, 2022

(65) Prior Publication Data
US 2024/0248395 A1    Jul. 25, 2024

(30) Foreign Application Priority Data
Jun. 2, 2021 (EP) .................................. 21177401

(51) Int. Cl.
G03F 7/00 (2006.01)
G03F 7/30 (2006.01)
G03F 9/00 (2006.01)

(52) U.S. Cl.
CPC .......... *G03F 7/0035* (2013.01); *G03F 7/0005* (2013.01); *G03F 7/30* (2013.01);
(Continued)

(58) Field of Classification Search
CPC .... G03F 7/0035; G03F 7/2051; G03F 7/2053; G03F 7/70466; G03F 7/70375;
(Continued)

(56) References Cited

U.S. PATENT DOCUMENTS

2009/0191490 A1  7/2009  Feldman
2010/0099051 A1  4/2010  Sandstrom et al.
(Continued)

FOREIGN PATENT DOCUMENTS

WO    2021071484 A1    4/2021

*Primary Examiner* — Susan D Leong
*Assistant Examiner* — Jennifer L Groux
(74) *Attorney, Agent, or Firm* — Eversheds Sutherland (US) LLP

(57) ABSTRACT

The invention relates to a lithographic process for embossing three-dimensional microstructures, which have oversized structure heights, in a photostructurable carrier material using an exposure device, wherein an oversized structure height has a height which exceeds the value of the maximum nominal penetration depth. The process comprises the following process steps:
  applying a photostructurable carrier material (1) to a layer height (H.1) on a substrate carrier (2);
  performing computer-aided modelling of a virtual three-dimensional structural model (10) of the microstructure to be embossed, the total height (H.10) of which structural model is greater than the maximum nominal penetration depth during exposure into the carrier material (1);
  performing computer-aided subdivision of the total height (H.10) of the structural model (10) into a number of sequentially stacked substructures (11, 12, 13);
(Continued)

calculating a virtual photomask (M.11, M.12, M.13) for each of the substructures (11, 12, 13);

performing a structuring on the basis of the virtual photomasks (M.11, M.12, M.13) by means of exposure and development (E) of the carrier material (1), until layer by layer all virtual photomasks (M.11, M.12, M.13) have been structured;

obtaining a finished structured carrier material (30) which contains a structuring corresponding to the entire structural model (S.10) and its total height (H.10).

19 Claims, 3 Drawing Sheets

(52) U.S. Cl.
CPC ...... *G03F 7/70008* (2013.01); *G03F 7/70291* (2013.01); *G03F 7/70383* (2013.01); *G03F 7/70416* (2013.01); *G03F 7/705* (2013.01); *G03F 7/70508* (2013.01); *G03F 7/70558* (2013.01); *G03F 9/7003* (2013.01)

(58) Field of Classification Search
CPC .. G03F 7/70383; G03F 7/704; G03F 7/70416; G03F 7/0005; G03F 7/0017; G03F 7/0037; G03F 7/2022; G03F 7/30
See application file for complete search history.

(56) References Cited

U.S. PATENT DOCUMENTS

2019/0278005 A1   9/2019   Young et al.
2023/0213869 A1*  7/2023   Chen ................... G03F 7/70425

* cited by examiner

LITHOGRAPHIC METHOD FOR IMPRINTING THREE-DIMENSIONAL MICROSTRUCTURES HAVING OVERSIZED STRUCTURAL HEIGHTS INTO A CARRIER MATERIAL

The invention relates to a lithographic process for embossing three-dimensional microstructures with large structure heights in a photostructurable carrier material.

In the course of miniaturisation in many areas of technology, microstructures have recently found numerous new fields of application, for example in optoelectronics, photonics, image processing sensors, machine vision, robotics and motion control systems. In these and other areas of application, there is often a need to be able to efficiently produce one-, two- and/or three-dimensional microstructures with greater structure heights or depths, for example from 100 micrometres (μm) down to the sub-millimetre (mm) scale, quickly and with the highest possible precision in a carrier material. Furthermore, in addition to the production of carrier materials that have one-dimensional (1D for short), two-dimensional (2D for short) and/or three-dimensional (3D for short) microstructures, possibly with overhangs or cavities, there is also the requirement that so-called 2.5D microstructures can be moulded into a carrier material. The term "2.5D" is understood by a person skilled in the art to mean objects or structures that are three-dimensional (3D) in themselves, but do not have a defined lower edge. In particular, 2.5D microstructures can have back tapers, undercuts and/or overhangs. For example, spherical lenses that are rounded at their lower edges are referred to as 2.5D structures. Such 2.5D microstructures can be used for optical applications, for example.

In the context of the present invention, the term "structure height" of the microstructure is also to be understood to mean a structure depth of the microstructure. In a three-dimensional Cartesian coordinate system, for example, a planar microstructure can be specified with a length in the X-axis direction and a width in the Y-axis direction. The structure heights of the microstructure are specified in the Z-axis direction, which is used to indicate the height. Depressions or cavities of the microstructure, which can be measured from a surface level, can also be specified as structure depths in the negative Z-axis direction. For the sake of simplicity, the term "structure heights" is mostly used in the following.

Two different methods are already known from the prior art, both of which utilise photons to structure the microstructures:

In maskless single-photon laser lithography (for short: 1PL), a layer of positive photoresist is exposed using a virtual, digital photomask and then developed. With the help of the virtual photomask, individual points of the photoresist layer can be exposed differently by locally varying an individual light dose and thus individually structured in conjunction with the subsequent one-time development.

However, the disadvantage here is that the penetration depth when exposing the photoresist is severely limited due to the fact that light absorption increases exponentially with the layer thickness of the photoresist. As a result, the possible maximum structure height or structure depth with which the photoresist can be structured is also subject to the same limitation. However, increasing the light dose, i.e. the light intensity per exposed area, can lead to the destruction of the photoresist above a certain limit. Positive photoresists currently available on the market can usually be exposed with a maximum light dose of 1200 mWs/cm². When using a single layer of a positive photoresist, the production of microstructures is therefore limited to a maximum structure height or structure depth of no more than 100 μm (micrometres).

Furthermore, so-called direct two-photon laser beam lithography (for short: 2PL) is known from the prior art and can be used, for example, for the additive manufacturing of micro-optical structures on a prefabricated 3D macro-optic.

The structuring of a carrier material is based on the sequential scanning of a so-called "voxel" using a virtual 3D photomask and the subsequent one-time development of the photoresist. In computer graphics, the term "voxel", a combination of the abbreviation syllables "vox" for "volume" and "el" for "elements", refers to a grid point or image point in a three-dimensional grid. In the case of a spatial data set that is available in discrete form in Cartesian coordinates, voxel refers to the discrete value at an XYZ coordinate of the data set.

The disadvantage of this method, which can also be used to produce 2.5D and real 3D structures with structure heights in the millimetre range, is the very slow writing speed of currently only around 3 mm² per hour. With this method, the layer height of each individual structure layer written corresponds to a voxel size, i.e. the size of a pixel, of less than one micrometre (μm). This technique is therefore limited to total areas to be structured of a few square millimetres at most. In addition, the excessively slow processing time means that such microstructures cannot be generated efficiently or cost-effectively and only with a low throughput.

A third known technology is diamond turning technology, which is, however, limited in principle to the production of rotationally symmetrical objects. Ultra-precision diamond turning technology, which was also developed for structuring 3D structures on a micrometre scale, also has weaknesses. For example, the structures of workpieces produced using ultra-precision diamond turning technology usually deviate from the specified structural shape on a micrometre scale. Deviations of up to 3 micrometres (μm) are common, and therefore diamond turning technology is not suitable for the precise structuring of microstructures.

The present invention therefore sets itself the task of providing an improved lithographic process for embossing three-dimensional microstructures, which have large structure heights, in a carrier material. The new process is intended to overcome the disadvantages known from the prior art:

Compared to single-photon laser beam lithography (1PL method) in particular, the new process should make it possible to produce microstructures with a structure height or depth of more than 100 micrometres (μm) quickly and with high precision.

Compared to two-photon laser beam lithography (2PL method), the new process should make it possible to produce comparatively large-area microstructures, for example with a base area of a few square centimetres, quickly and with a high throughput.

These tasks are solved by a lithographic process of the type mentioned at the outset having the features of claim 1. Advantageous embodiments and developments of the invention are set out in the dependent claims and the description.

According to the invention, a lithographic process is provided for embossing three-dimensional microstructures, which have oversized structure heights, in a photostructurable carrier material using an exposure device, wherein, depending on exposure parameters of the exposure device in conjunction with exposure properties of the photostructurable carrier material, a maximum nominal penetration depth of the exposure and thus a resulting photostructuring of the carrier material are produced and an oversized structure height has a height which exceeds the value of the maximum nominal penetration depth, said process having the following process steps:

—a— applying a photostructurable carrier material to a surface of a substrate carrier, wherein the applied carrier material has a layer height and a flat surface on the upper side opposite the substrate carrier, and wherein the properties of the carrier material can be changed by exposure to electromagnetic radiation;

—b— using information data as an input variable, wherein this information data contains information on the maximum nominal penetration depth of the selected photostructurable carrier material and on the geometric shape of a three-dimensional microstructure to be embossed having an oversized structure height;

—c— performing a computer-aided modelling of a virtual three-dimensional structural model of the microstructure to be embossed as a function of the information data according to step —b—, wherein the structural model comprises topography data of the microstructure to be moulded and a total height of the structural model to the microstructure to be moulded is determined on the basis of the topography data, which total height is greater than the maximum nominal penetration depth of the electromagnetic radiation during exposure into the carrier material and less than the applied layer height of the carrier material;

—d— performing a computer-aided subdivision of the total height of the three-dimensional structural model into a number N (N≥2 to n), wherein the number N is a running variable from N≥2 to N=n, of sequentially stacked height layers, wherein each of the N (N≥2 to n) height layers corresponds to a single substructure of the structural model, and wherein each one of the N (N≥2 to n) substructures has a subheight, wherein the number N is an integer which is greater than or equal to the number 2, and wherein the number N (N≥2 to n) is selected such that each of the N (N≥2 to n) subheights is less than or equal to the possible nominal penetration depth of the electromagnetic radiation deliverable by the exposure device when exposed into the carrier material, wherein the sum of the N (N≥2 to n) subheights of the individual substructures corresponds to the total height of the structural model;

—e— calculating a virtual photomask for each individual one of the N (N≥2 to n) substructures of the structural model, wherein for each of the N (N≥2 to n) photomasks the respective topography data of each individual substructure is converted into corresponding values of an individual exposure dose, wherein the exposure dose calculated for a specific location of a substructure correlates with the individual height position of the same location within the corresponding substructure;

—f— positioning a first virtual photomask, which corresponds to the first substructure in the lowest height layer of the structural model, as well as alignment markings on the surface of the carrier material;

—g— performing an aligned exposure of the carrier material using the alignment markings arranged on the surface, wherein a structuring of the first substructure is written into the carrier material starting from the surface of the carrier material by spatially resolved exposure in accordance with the individual exposure dose defined in the first virtual photomask;

—h— performing a wet-chemical development of the exposed portion of the carrier material specified by the first virtual photomask, wherein the surfaces of the structuring of the first substructure are smoothed as a function of a development rate of the carrier material and of the calculated exposure dose until the surfaces of the structuring are optically smooth after exposure and development;

—i— obtaining a first intermediate product of a partially structured carrier material, wherein the first intermediate product contains a structuring of the first substructure;

—j— positioning a further Nth (N≥2 to n) virtual photomask, wherein the Nth (N≥2 to n) virtual photomask corresponds to the Nth (N≥2 to n) substructure in the next-higher Nth (N≥2 to n) height layer of the structural model sequentially following the preceding (N−1) height layer, within the already structured structuring of the preceding (N−1) substructure of the preceding (N−1) intermediate product;

—k— performing an aligned further exposure of the preceding (N−1) intermediate product on the basis of the alignment markings arranged on the surface, wherein, starting from the already structured structuring of the preceding (N−1) substructure, a structuring of the Nth (N≥2 to n) substructure is written into the preceding (N−1) intermediate product of a partially structured carrier material by spatially resolved exposure in accordance with the individual exposure dose defined in the Nth (N≥2 to n) virtual photomask, wherein the structuring of the Nth (N≥2 to n) substructure within the carrier material is in each case deeper than the structuring of the respective preceding (N−1) substructure;

—l— performing a wet-chemical development of the exposed portion of the carrier material specified by the Nth (N≥2 to n) virtual photomask, wherein the surfaces of the structuring of the Nth (N≥2 to n) substructure are smoothed as a function of a development rate of the carrier material and of the calculated exposure dose until the surfaces of the structuring are optically smooth after exposure and development;

—m— if necessary, repeating a sequence of steps —j— (positioning of a further virtual photomask), —k— (further exposure) and —l— (further development) until all N (N≥2 to n) virtual photomasks have been structured layer by layer;

—n— obtaining a finished structured carrier material, wherein the finished structured carrier material contains a structuring corresponding to the entire structural model and its total height.

The term "oversized structure height" is used here to refer to microstructures whose structure heights are greater than the maximum nominal penetration depth of the exposure in a photostructurable carrier material.

The maximum nominal penetration depth of the exposure depends on the following parameters:
selection of the photostructurable carrier material used and the possible exposure depths, which depend on the photochemical material properties of the selected carrier material;
selection of the appropriate light dose for non-destructive exposure of the carrier material;
selection of the exposure device used;
selection of the appropriate development time.

Depending on the exposure parameters of the selected exposure device, such as the development time, and in conjunction with the exposure properties or material properties of the photostructurable carrier material, such as the maximum light dose that can be selected without destroying the carrier material, this results in a maximum nominal penetration depth of the exposure, which with the materials and devices currently available is approximately 100 micrometres (μm) maximum nominal penetration depth.

For example, it may be appropriate to use a 4× microscopic objective with a numerical aperture of 0.14 as the exposure device. Furthermore, it may be useful to select a light dose of 750 mWs/cm$^2$ in order to achieve an exposure depth in the photostructurable carrier material of approximately 50 micrometres (μm) at a light wavelength of 405 nanometres (nm) and a writing speed of 100 mm/s using maskless single-photon laser beam lithography (1PL for short). When selecting the development time, it can be advantageous, for example, to select a development time of 30 minutes, especially if the product AZ® 2026 MIF Developer from Microchemicals (www.michrochemicals.com) is used as the developer.

Oversized structure heights are thus defined below as having heights that are greater than the aforementioned reference value of approximately 100 micrometres (μm) and that can also be significantly greater than this reference value. Advantageously, the process according to the invention can also be used to emboss or write, in the photostructurable carrier material, structures whose structure heights can be in the order of 500 micrometres (μm) or more, for example. Such oversized structure heights are also referred to below as structure heights on a sub-millimetre (mm) scale.

In step —a—, a photostructurable carrier material is first applied to the surface of a substrate carrier. Preferably, the photostructurable carrier material can be a photoresist which, if necessary, is applied in several layers on top of one another until a correspondingly large layer height of the two-dimensional carrier material is present, which is correspondingly greater than the oversized structure heights of the three-dimensional microstructure to be embossed which are to be transferred into the carrier material.

The photostructurable carrier material can be applied, for this purpose, to the substrate carrier using one of the following common coating methods, once or more: dip coating, spin coating, slot die coating, doctor blading, curtain coating or by means of metering rod or Meyer bar coating.

In step —b—, corresponding information for the subsequent modelling of the three-dimensional microstructure is collected on the basis of the maximum nominal penetration depth when exposing the selected carrier material and on the basis of the geometric shape, in particular contour data, of the microstructure to be embossed, which has oversized structure heights.

Step —c— can expediently be carried out using CAD files (Computer Aided Design), which are generated, from the three-dimensional microstructure to be embossed, as a virtual or digital three-dimensional structural model depending on the previously determined information. The virtual structural model comprises topography data of the microstructure to be moulded, wherein the topography data is used to determine an overall height of the structural model in relation to the microstructure to be moulded. This total height of the structural model is greater than the maximum nominal penetration depth of the electromagnetic radiation when exposing the carrier material and less than the applied layer height of the carrier material. As stated above, microstructures with a total structure height or a total structure depth of at least 100 micrometres (μm) and above up to structure heights in the sub-mm range can be moulded. The structure height or structure depth is then related to a Z-axis direction in a three-dimensional Cartesian coordinate system, with the Z-axis direction indicating the height position.

The term "topography" (from Greek: tópos, "place", and grafeïn, "to draw" or "to describe"; literally "description of place") is understood to mean the surface characteristics or the description of both the geometric shape and the physical and chemical properties of technical surfaces or microstructures. The description of the topography (surface roughness, surface shape, etc.) is usually based on data from measurement methods.

In the next step —d— a computer-aided subdivision is performed of the total height of the three-dimensional structural model into a number N (N≥2 to n), wherein the number N is a running variable from N≥2 to N=n, of at least two or more sequentially stacked height layers, the subheights of which are each less than or equal to the possible nominal penetration depth of the electromagnetic radiation that can be delivered by the exposure device during exposure into the carrier material, wherein the sum of the subheights of the individual substructures corresponds to the total height of the structural model. The subdivision into at least two or more stacked height layers of the virtual structural model is performed in the Z-axis direction corresponding to the height position of a Cartesian coordinate system.

The next step —e—, the calculation of a virtual photomask for each individual substructure of the virtual structural model, is preferably used to control a device for maskless grey-tone lithography. Each virtual photomask thus represents the individual exposure dose or the light intensity for a specific location of the substructure.

A maximum structure height of a specific location of the respective height position or substructure of the structural model corresponds to a maximum depth with which this location of the substructure can be embossed or inscribed in the carrier material. The inversion of a structure height of the corresponding substructure of the structural model into a structure depth of the structuring of this substructure in the carrier material results from the photochemical structuring.

The developable layer thickness usually increases nonlinearly with the exposure dose or light intensity per time unit [in mWs/cm$^2$].

Subsequently, in step —f—, a first virtual photomask, which corresponds to the first substructure in the lowest height layer of the structural model, wherein alignment markings for embossing on the surface of the carrier material are also stored in the first virtual photomask, is positioned accordingly on the surface of the carrier material.

In the next step —g—, an aligned exposure of the carrier material is carried out using the alignment markings arranged on the surface of the carrier material, wherein a structuring of the first substructure is written into the carrier material starting from the surface of the carrier material by spatially resolved exposure in accordance with the individual exposure dose defined in the first virtual photomask.

Subsequent to the exposure, in step —h— the wet-chemical development of the exposed portion of the carrier material predetermined by the first virtual photomask takes place, wherein the surfaces of the structuring of the first substructure are smoothed as a function of a selected structuring strategy, namely as a function of the development rate of the carrier material used and of the calculated exposure dose, until the surfaces of the structuring are optically smooth after the exposure and development.

The term "optically smooth surface" is familiar to a person skilled in the art of moulding processes, particularly for the manufacture of optical components. As can be seen, for example, in the reference book "Optische Meßtechnik an technischen Oberflächen" ("Optical Measurement Technology on Technical Surfaces") by Alexander W. Koch et al., expert-Verlag (publisher) 1998, ISBN 3-8169-1372-5, a surface is described as "optically smooth" if its surface roughness or structure is far below the wavelength A (lambda) of the visible spectral range of light. For optically high-quality components, the requirement of a maximum unevenness over an optically smooth surface of $\lambda/16$ applies.

For the visible spectral range of light with wavelengths A of approximately 380 nm to 780 nm, this means that the roughness values of "optically smooth" surfaces must not exceed 23.75 nm (380 nm/16) to 48.75 nm (780 nm/16).

The criterion that the surfaces of the structuring, i.e. the structured recess on the upper side of the carrier material, must be optically smooth after exposure and development has the effect of preventing unwanted scattered light effects in one or more subsequent further exposure steps. Particularly in the case of further laser structuring, it is important to achieve further structuring without stray light effects and the associated sources of error.

The lower the roughness of the structured surfaces, expressed as the centre roughness value Ra, the lower the scattered light effects that can occur during the subsequent, next structuring process by further exposing and developing the previously structured surfaces. This means that further structuring by means of exposure and development can be carried out all the more precisely. Advantageously, the structuring of the surfaces in the structured recess or cavity within the carrier material is carried out in such a way that roughness values for the optically smooth surfaces are preferably set to less than or equal to 30 nm (nanometres).

The term "structuring" is understood here as a combination of the process steps "aligned exposure" (step —g—) and "wet-chemical development" (step —h—).

The result of structuring is therefore a structure written into the carrier material, which structure has optically smooth surfaces that are suitable for one or more subsequent, further structuring steps.

According to step —i—, a first intermediate product of a partially structured carrier material is thus produced, wherein the first intermediate product contains a structuring of the first substructure.

The further steps —j—, —k— and —l— are used to structure a next virtual photomask corresponding to a subsequent, next height position of the virtual structural model within the previously generated structuring.

According to step —m—, a sequence of steps —j— (positioning of a further virtual photomask in each case), —k— (further exposure) and —l— (further development) is repeated as often as necessary until all virtual photomasks have been structured layer by layer.

According to step —n—, a finished structured carrier material is obtained as a product according to the process, wherein the finished structured carrier material contains a structuring corresponding to the entire virtual three-dimensional structural model along its total height or together with its total height. The finished structured carrier material can also be used, for example, as a master for further moulding of the original structure using galvanic methods or for producing a stamp by silicone moulding.

This process is a novel inverse lithographic process for embossing three-dimensional (3D) microstructures in a photochemically structurable carrier material, wherein the three-dimensional microstructures have oversized structure heights in the micrometre to sub-millimetre scale, which could not be produced quickly and precisely with the currently known manufacturing processes.

In a process according to the invention, it can be advantageous if the photostructurable carrier material is a positive-working photoresist in which exposed portions are removed from the carrier material during subsequent wet-chemical development.

Photoresists are used in photolithographic structuring, particularly in microelectronics and microsystems technology for the production of structures in the micro- and sub-micrometre range and in the manufacture of printed circuit boards. The most important starting materials for photoresists are polymers (e.g. polymethyl methacrylate, polymethyl glutarimide) or epoxy resins, solvents such as cyclopentanone or gamma-butyrolactone, as well as a photosensitive component.

In addition to liquid photoresists, there are also solid or dry resists (photofilms).

During exposure, the solubility of the photolayer is changed locally by the electromagnetic radiation in the form of the ultraviolet light component, which corresponds to the light dose of the virtual photomask (photochemical reaction).

According to the change in solubility, a distinction is made as follows:
negative-working photoresist (negative tone photoresist): the solubility decreases through exposure to light
positive-working photoresist (positive tone photoresist): the solubility increases through exposure to light.

In the case of positive-working photoresists, the photoresist, which may already be solidified, is photochemically modified by exposure and thus soluble for corresponding developer solutions, and after development only those areas remain which have been protected from irradiation by a corresponding mask or which are located outside the exposed portions.

The use of positive-working photoresist as a photostructurable carrier material offers the advantage that it is possible to structure deeper and deeper into the positive photoresist layer by layer, height layer by height layer—corresponding to the calculated virtual photomasks—in order to finally obtain recesses or cavities in the finished structured positive photoresist, the total heights of which correspond to those of the specified structural model. Non-structured areas of the positive-working photoresist, which have therefore not been exposed and developed, advantageously retain the initially selected layer height (according to step —a—).

The finished structured carrier material in the form of a positive-working photoresist can also be used, for example, as a master for further moulding of the original structure using galvanic methods or for producing a stamp by silicone moulding.

It can be particularly advantageous if, in a process according to the invention, the aligned exposure of the carrier material is carried out either by means of maskless laser lithography based on 1-photon and/or 2-photon absorption or by means of optical maskless lithography, wherein a spatial light modulator and an imaging optics are used.

The term "maskless laser lithography" is understood by a person skilled in the art to mean a process for exposing the photostructurable carrier material, preferably the positive-working photoresist, by means of focussing laser beam using sequential scanning and simultaneous modulation of the light intensity. Laser light is used as the exposure source. The advantages of this exposure process are that maskless laser lithography enables a particularly precisely defined light dose per pixel, i.e. at a location in the data set that is precisely defined using the XYZ coordinates. Due to the possibility of using one-photon absorption (1PL for short) and/or two-photon absorption (2PL for short), it is possible to produce real 3D structures with this exposure process. However, this exposure process is rather slow due to the sequential scanning.

The term "optical maskless lithography" is understood by a person skilled in the art to mean a process for exposing the photostructurable carrier material, preferably the positive-working photoresist, in which the structuring is carried out by optical imaging of a surface (pixel matrix) of a spatial light modulator on the carrier material or preferably the photoresist. UV light, which is generated using UV LEDs for example, is used as the exposure source. The advantage of this exposure method is that the surface exposure can take place much more quickly than with maskless laser lithography. A disadvantage of optical maskless lithography, however, is that true 3D structuring with this exposure process may require tilting of the corresponding sample or carrier material during structuring. In a preferred embodiment of the invention, it can be advantageous, particularly for structuring undercuts, if at least one virtual photomask is positioned on the surface of a carrier material that is tilted at a tilt angle using alignment markings.

As mentioned above, especially when using optical maskless lithography as an exposure process, it may be necessary to tilt the carrier material during the structuring of real 3D structures such as back tapers, undercuts and/or overhangs. The corresponding tilt angle at which the carrier material needs to be tilted can be set using a motorised goniometer, for example.

With the process according to the invention, it is also possible for several or all virtual photomasks to be positioned on the surface of a carrier material that is arranged tilted at a tilt angle. Furthermore, the process according to the invention provides for the carrier material for several or all virtual photomasks to be tilted at the same tilt angle or at individual, different tilt angles for each height layer to be structured or for each virtual photomask for exposure.

In a development of this advantageous process variant, the aligned exposure of the carrier material and the subsequent wet-chemical development of the exposed portion of the carrier material specified by the at least one virtual photomask can be carried out using alignment markings on the surface of a carrier material that is arranged tilted at a tilt angle.

The alignment markings, which are structured together with the first virtual photomask on the surface of the carrier material, also serve to precisely position the further, subsequent structuring steps in the event of tilted exposure or tilted structuring of the carrier material.

It can be particularly expedient if, in the process according to the invention, the photostructurable carrier material has a layer height greater than 100 micrometres ($\mu m$), preferably greater than 200 micrometres ($\mu m$), particularly preferably greater than 500 micrometres ($\mu m$), wherein the carrier material is preferably applied to the substrate carrier in multiple layers.

The layer height of the carrier material should be selected here so that the carrier material has a sufficient layer thickness to accommodate the entire structural model, in particular the total height of the structural model.

Advantageously, in the process according to the invention, the total height of the structural model can be greater than 100 micrometres ($\mu m$).

Advantageously, the process according to the invention can be used to produce three-dimensional microstructures with oversized structure heights on a micrometre to sub-millimetre scale, which could not previously be produced quickly and precisely using the currently known manufacturing processes. The overall height of the structural model, which is modelled in step —c—, can therefore also be significantly greater than 100 micrometres ($\mu m$) and can reach up to the sub-millimetre scale.

In a further advantageous variant of the invention, the number N (N≥2 to n) can be selected in the process such that each of the N (N≥2 to n) subheights of the individual substructures is less than or equal to a maximum nominal penetration depth, preferably less than 30 micrometres ($\mu m$), particularly preferably less than 20 micrometres ($\mu m$).

As already mentioned above, the maximum nominal penetration depth during exposure is largely determined by a combination of the following factors:
 the maximum possible light dose without destroying the carrier material;
 the maximum development time;
 the photochemical material properties of the carrier material used.

Based on these factors, preliminary tests have shown that, depending on the application, precise structuring of the carrier material may be possible if, for example, the subheights of the substructures are selected to be less than or equal to 50 micrometres ($\mu m$). The smaller the subheights of the substructures are selected, the more precisely even complex structural models, i.e. structural models with complex geometric shapes that include undercuts, for example, can be written into the carrier material using the process.

In a process according to the invention, it can be particularly expedient if the number N (N≥2 to n) is selected such that each of the N (N≥2 to n) subheights of the individual substructures has the same subheight, which subheight is less than or equal to a maximum nominal penetration depth, preferably less than 30 micrometres ($\mu m$), particularly preferably less than 20 micrometres ($\mu m$).

In this variant, it is possible to always work efficiently with the same subheight of each substructure.

Particularly precise structuring can be achieved if, in a process according to the invention, the optically smooth surfaces of the substructures after exposure and development have a roughness with a mean roughness value Ra of at most 50 nanometres (nm), preferably of at most 40 nanometres (nm), particularly preferably of at most 30 nanometres (nm).

Particularly in the case of further laser structuring, optically smooth surfaces offer the advantage of being able to carry out the subsequent, further structuring without scattered light effects and thus without the associated error sources.

Further details, features and advantages of the invention can be found in the following explanation of exemplary embodiments shown schematically in the drawings. The drawings show, in each case in a side view:

FIG. 1 a photostructurable carrier material, which is applied in a layer height on a substrate carrier;

FIG. 2 a three-dimensional structural model of a microstructure according to a first variant, which is to be transferred into the carrier material;

FIG. 3 the structural model shown in FIG. 2 after subdivision into several substructures corresponding to a sequence of several stacked height layers;

FIG. 4 several virtual photomasks that correspond to the topography data of the individual substructures or height layers of the structural model;

Figure 2:
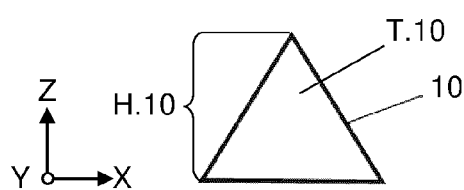
Figure 7:
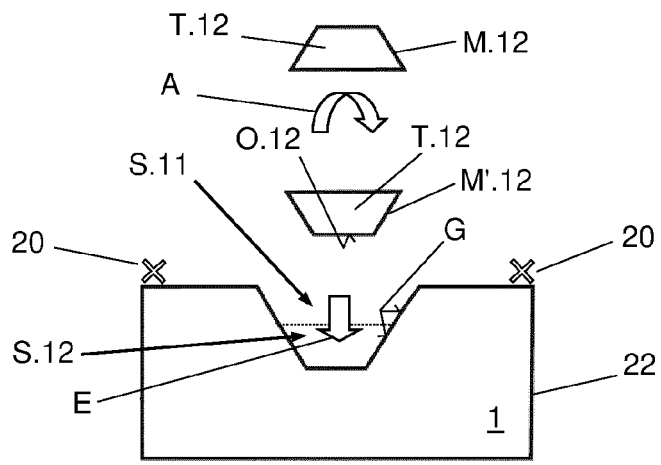
Figure 8:
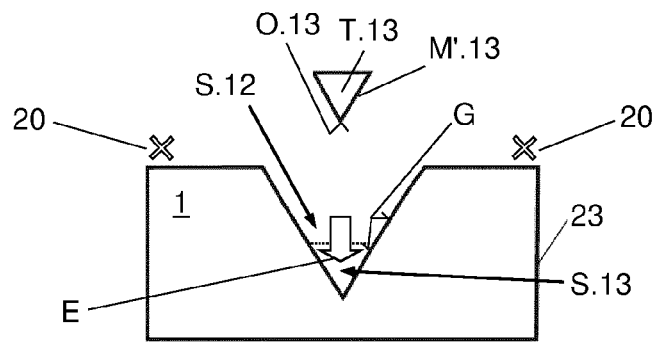
Figure 9:
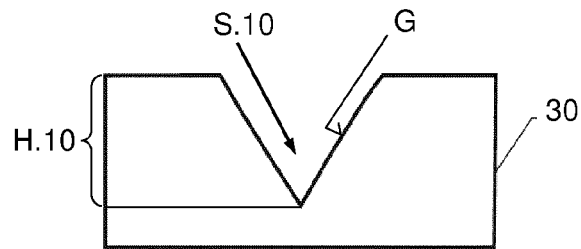
Figure 10:
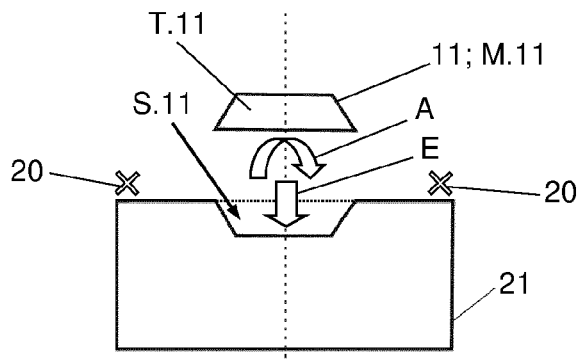
Figure 11:
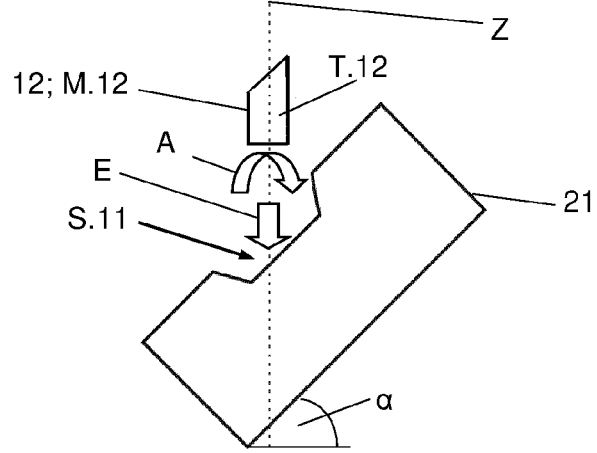
Figure 12:
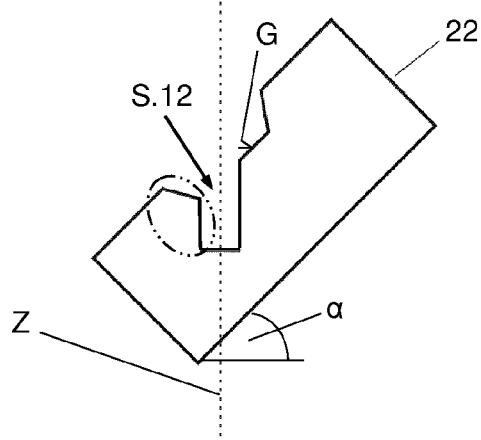

FIG. 7 after exposing and developing the carrier material using the first virtual photomask, the positioning of a further, second virtual photomask, which corresponds to the second substructure of the next-higher height layer of the structural model sequentially following the lowest height layer, within the already structured structuring of the first substructure;

FIG. 8 after exposing and developing the carrier material using the first and second virtual photomask, the positioning of a further, third virtual photomask within the previously produced structuring;

FIG. 9 a finished structured carrier material with a structuring of the entire structural model shown in FIG. 2;

FIG. 10 the positioning of a first virtual photomask, which corresponds to the first substructure of the lowest height layer of a structural model of a microstructure according to a second variant, together with alignment markings on the surface of the carrier material;

FIG. 11 after exposing and developing the carrier material using the first virtual photomask, the positioning of a further, second virtual photomask, which corresponds to the second substructure of the next-higher height layer of the structural model sequentially following the lowest height layer, in a position tilted at a tilt angle within the already structured structuring of the first substructure;

FIG. 12 a finished structured carrier material with a structuring of a structural model with an overhang.

In the following detailed description of the figures, reference is made to FIG. 1 to FIG. 9, which relate to a first variant of the process according to the invention.

Figure 1:
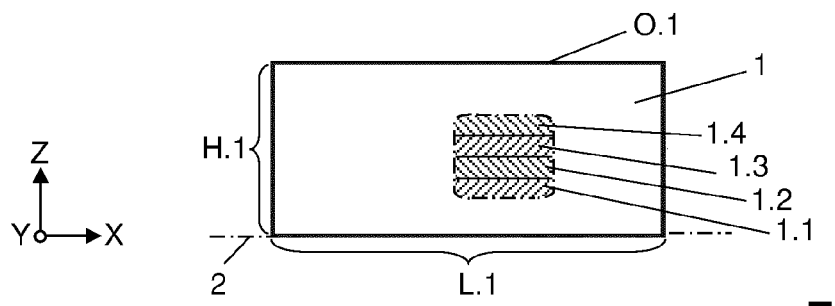

FIG. 1 schematically shows a photostructurable carrier material 1, for example a positive-working photoresist, which is applied in several flat layers 1.1, 1.2, 1.3, 1.4 in a total layer height H.1 on a substrate carrier 2. The substrate carrier 2 used here is a flat glass plate, for example. The several layers 1.1, 1.2, 1.3, 1.4, from which the carrier material 1 is applied, are symbolised in a partial sectional view in FIG. 1. In fact, it is important that the several layers 1.1, 1.2, 1.3, 1.4 of the positive-working photoresist bond together as homogeneously as possible in order to obtain a homogeneously structured carrier material 1 with a large layer height H.1, which has the same photochemical material properties at every location, where possible. The layer height H.1 or layer thickness of the carrier material 1 or photoresist is selected here, for example, at 900 µm (micrometres). In a Cartesian coordinate system, the height direction of the layer height H.1 corresponds to the Z-axis direction. The carrier material 1 has a flat surface O.1 or outer surface that extends in the direction of the X-Y plane.

For example, the product AZ® 4562 ("Positive thick resist") or the product AZ® 9260, both from Microchemicals (www.microchemichals.com), can be used here as a positive-working photoresist. The maximum nominal penetration depth of the exposure for these photoresists is around 75 micrometres (µm).

FIG. 2 shows a side view of a digitally generated, virtual three-dimensional structural model 10 of a three-dimensional microstructure that is to be transferred to the carrier material 1. The structural model 10 comprises the topography data T.10 of the microstructure to be moulded. The structural model 10 has a total height H.10 that corresponds to the maximum extent of the structural model 10 in the Z-axis direction. The total height H.10 of the structural model 10 is, for example, 400 µm (micrometres) and is therefore greater than the maximum nominal penetration depth of the electromagnetic radiation when exposing the carrier material (around 75 µm) and less than the applied layer height H.1 of 900 µm of the carrier material 1 on the substrate carrier 2.

Figure 3:
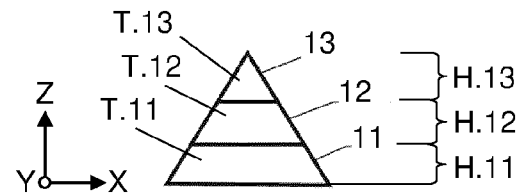

FIG. 3 shows the virtual three-dimensional structural model 10 shown in FIG. 2 after the computer-aided subdivision into several substructures 11, 12, 13 corresponding to a sequence of several stacked height layers. Each substructure 11, 12, 13 has a subheight H.11, H.12, H.13, wherein each of the subheights H.11, H.12, H.13 is less than or equal to the possible nominal penetration depth when the carrier material 1 is exposed.

Here, for example, the same subheight H.11, H.12, H.13 is selected for each substructure 11, 12, 13, which here is 40 µm, for example, and is thus less than the nominal penetration depth when the carrier material 1 is exposed. In fact, in the case mentioned here as an example, the total height H.10 of 400 µm must be divided into 10 substructures 11, 12, 13, etc. stacked on top of each other, wherein each of the substructures here has the same subheight H.11, H.12, H.13, etc., for example 40 µm in each case. Each substructure 11, 12, 13 has the associated topography data T.11, T.12, T.13. For the sake of simplicity, however, the illustration in the following schematic figures is limited to the three stacked substructures 11, 12, 13 shown. However, it is familiar to a person skilled in the art to subdivide corresponding virtual structural models 10 into a plurality of substructures, possibly with different subheights, as required.

Figure 4:
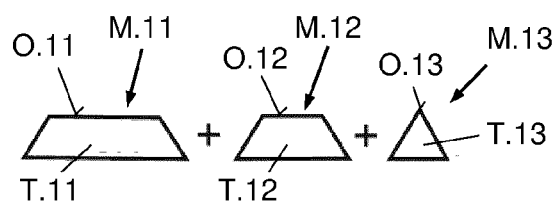

FIG. 4 shows a plurality of virtual photomasks M.11, M.12, M.13, which are calculated for each of the individual substructures 11, 12, 13 of the structural model 10. For this purpose, the respective topography data T.11, T.12, T.13 of the individual substructures 11, 12, 13 or height layers of the structural model 10 are converted into corresponding values of an individual exposure dose. The upper sides of the substructures 11, 12, 13 labelled O.11, O.12 and O.13 are merely used here to clearly assign how the individual substructures 11, 12, 13 are stacked on top of each other to form the entire structural model 10. The photomasks M.11, M.12, M.13 shown schematically in FIG. 4 correlate with the topography data T.11, T.12, T.13 of the individual substructures 11, 12, 13 insofar as the individual exposure dose calculated for a specific location X, Y, Z of a substructure 11, 12, 13 is related to the associated individual height position or to the coordinate value in the Z-axis direction of the same location point X, Y, Z within this substructure 11, 12, 13.

Figure 5:
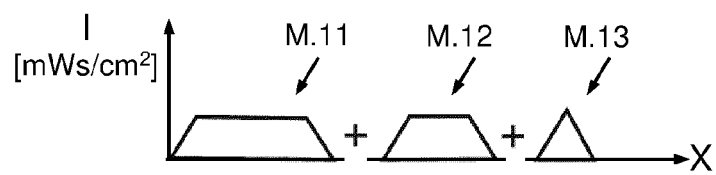
FIG. 5 shows in simplified graph form the correlation of the respective exposure dose of each virtual photomask with the topography data of each individual substructure.

FIG. 5 shows, in a simplified graph form, the correlation of the respective exposure dose I (in mWs/cm$^2$) of each virtual photomask M.11, M.12, M.13 with the topography data of each individual substructure 11, 12, 13. The higher the local exposure dose I is selected, the deeper those higher locations X, Y, Z within a substructure 11, 12, 13, wherein the height position of the locations refers to their position in the structural model 10, can be written into the carrier material 1 during the subsequent structuring by means of the virtual photomasks M.11, M.12, M.13. In relation to the carrier material 1, a higher exposure dose I therefore means that it is possible to write deeper into the carrier material 1.

Figure 6:
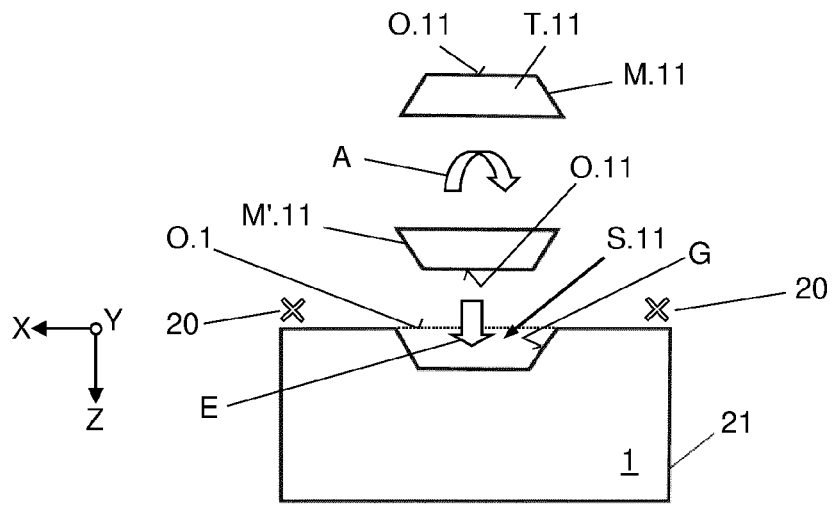
FIG. 6 shows the positioning of a first virtual photomask, which corresponds to the first substructure of the lowest height layer of the structural model, together with alignment markings on the surface of the carrier material.

FIG. 6 shows the positioning of a first virtual photomask M.11, which corresponds to the first substructure 11 of the lowest height layer of the structural model 10, together with alignment markings 20 on the surface O.1 of the carrier material 1 or the positive-working photoresist. The positioning of the photomask M.11 is symbolised here by an arrow A. The alignment markings 20, which are also used to align the subsequent process steps, are contained in the first virtual photomask M.11 and are structured together therewith.

To illustrate the mode of action of the photochemical structuring, which comprises the aligned exposure of the exposed portion of the carrier material 1 specified by the first virtual photomask M.11 and the subsequent wet-chemical development, and which is symbolised by the arrow E, an inverted first virtual photomask M'.11 is also shown here in FIG. 6. The inverted first virtual photomask M'.11 corresponds to the first virtual photomask M.11, but with changed or inverted polarity.

The inversion of a structure height H.11 (in "positive" Z-axis direction according to FIG. 3) of the corresponding first substructure 11 of the structural model 10 into a structure depth of the structuring S.11 of this substructure 11 in the carrier material 1 (in "negative" Z-axis direction according to FIG. 6) results from the photochemical structuring. The structuring parameters are selected here in such a way that the surfaces of the structuring S.11 are optically smooth G after the structuring E, as after exposure and development. Position 21 refers to the first intermediate product 21 of the structured carrier material 1, which is structured with the structuring S.11 corresponding to the first substructure 11.

FIG. 7 illustrates the positioning of a further, second virtual photomask M.12, which corresponds to the second substructure 12 of the next-higher height layer of the structural model 10 sequentially following the lowest height layer, within the already structured structuring S.11 of the first substructure 11 after exposure and development E of the carrier material 1 using the first virtual photomask M.11.

Once again, the second virtual photomask M.12 is positioned on the surface O.1 of the carrier material 1 using the alignment markings 20, which is symbolised by arrow A.

The further structuring, which comprises the aligned exposure of the exposed portion of the carrier material 1 specified by the second virtual photomask M.12 and the subsequent wet-chemical development, is symbolised by the arrow E.

Similarly to FIG. 7, an inverted second virtual photomask M'.12 is also shown here in FIG. 7. The inverted second virtual photomask M'.12 again corresponds to the second virtual photomask M.12, but with changed or inverted polarity.

The inversion of the structure height H.12 (in "positive" Z-axis direction according to FIG. 3) of the corresponding second substructure 12 of the structural model 10 into a structure depth of the structuring S.12 of this substructure 12 in the carrier material 1 (in "negative" Z-axis direction according to FIG. 7) is again the result of the photochemical structuring. The structuring parameters are selected in such a way that the surfaces of the structuring S.12, which is arranged within or below the previously structured cavity S.11, are optically smooth G after structuring E, as after exposure and development. Position 22 refers to the second intermediate product 22 of the structured carrier material 1, which is additionally structured with the structuring S.12 corresponding to the second substructure 12.

FIG. 8 represents a repetition of the structuring steps already shown in FIG. 6 and FIG. 7 and shows, after the previously performed structuring E, i.e. the exposure and development of the carrier material 1, the positioning of a further, third virtual photomask M.13 within the previously produced structuring S.12 using the first M.11 and second virtual photomask M.12.

The inverted third virtual photomask M'.13 shown here corresponds again to the third virtual photomask M.13 as illustrated in FIG. 5, for example, but with changed or inverted polarity.

The further structuring, which comprises the aligned exposure of the exposed portion of the carrier material 1 specified by the third virtual photomask M.13 and the subsequent wet-chemical development, is again symbolised by the arrow E.

The structuring parameters are selected here in such a way that the surfaces of the structuring S.13, which is arranged within or below the previously structured cavity S.12, are also optically smooth G after structuring E, as after exposure and development. Position 23 refers to the third intermediate product 23 of the structured carrier material 1, which is additionally already structured with the structuring S.13 corresponding to the third substructure 13.

By repeating, correspondingly, the positioning of further virtual photomasks, which are used for further layer-by-layer structuring E, all substructures are structured deeper and deeper into the carrier material 1 until the carrier material 1 finally contains the structuring of the entire structural model S.10 corresponding to its total height H.10.

FIG. 9 shows a side view of a finished structured carrier material 30 with a structuring of the entire structural model 10 shown in FIG. 2 as a product of the manufacturing process.

The further figures FIG. 10 to FIG. 12 relate to a further variant of the process according to the invention, which differs from the variant described above substantially only in the tilting of the carrier material 1 for structuring undercuts. The same position designations are used for comparable process features. Reference is made to the previous detailed explanation.

FIG. 10 shows—comparably to FIG. 6—the positioning of a first virtual photomask M.11, which corresponds to the first substructure 11 of the lowest height layer of a structural model 10 of a microstructure according to a second variant, together with alignment markings 20 on the surface of the carrier material 1.

FIG. 11 shows the positioning of a further, second virtual photomask M.12, which corresponds to the second substructure 12 of the next-higher height layer of the structural model 10 sequentially following the lowest height layer, in a position tilted at a tilt angle α within the previously produced structuring S.11 of the first substructure 11 after structuring E, i.e. the exposure and development of the carrier material 1. The tilt angle α at which the carrier material 1 or in this case the first intermediate product 21 of the structured carrier material 1 is tilted, is specified in relation to the horizontal, i.e. the X-Y plane in the Cartesian coordinate system.

FIG. 12 shows a second intermediate product 22, in which the further second structuring S.12 is already produced, which forms a three-dimensional undercut or an overhang of the structuring. The portion of the undercut is marked in FIG. 12 by a two-dot-and-dash line. If necessary, by repeating further structuring steps accordingly, a finished structured carrier material with a structuring of a structural model with an overhang can be produced.

LIST OF REFERENCE SIGNS 1 photostructurable carrier material, photoresist
1.1 layer of the carrier material (or further layers 1.2, 1.3, 1.4)
2 substrate carrier
10 structural model
11 first substructure of the structural model
12 second substructure of the structural model
13 third substructure of the structural model
20 alignment marker
21 first intermediate product of the structured carrier material
22 second intermediate product of the further structured carrier material
23 third intermediate product of the structured carrier material
30 structured carrier material
A positioning the virtual photomask (arrow)
E exposing and developing (arrow)
G optically smooth surface
H.1 layer height of the carrier material
H.10 total height of the structural model
H.11 subheight of the first substructure of the structural model
H.12 subheight of the second substructure of the structural model
H.13 subheight of the third substructure of the structural model
L.1 length of the carrier material
M.11 first virtual photomask of the first substructure of the structural model
M.12 second virtual photomask of the second substructure of the structural model
M.13 third virtual photomask of the third substructure of the structural model
M'.11 inverted first virtual photomask (with changed polarity)
M'.12 inverted second virtual photomask (with changed polarity)
M'.13 inverted third virtual photomask (with changed polarity)
O.1 surface or outer face of the carrier material
O.11 upper side of the first virtual photomask
O.12 upper side of the second virtual photomask
O.13 upper side of the third virtual photomask
S.10 structuring of the entire structural model
S.11 structuring of the first substructure of the structural model
S.12 structuring of the second substructure of the structural model
S.13 structuring of the third substructure of the structural model
T.10 topography data of the entire structural model
T.11 topography data of the first substructure
T.12 topography data of the second substructure
T.13 topography data of the third substructure
X X-axis direction
Y Y-axis direction
Z Z-axis direction
A tilt angle

The invention claimed is:

1. A lithographic process for embossing three-dimensional microstructures, which have oversized structure heights, in a photostructurable carrier material using an exposure device, wherein, depending on exposure parameters of the exposure device in conjunction with exposure properties of the photostructurable carrier material, a maximum nominal penetration depth of an exposure and thus a resulting photostructuring of the carrier material are produced and an oversized structure height has a height which exceeds the value of the maximum nominal penetration depth, wherein the process comprises the following process steps:

—a— applying a photostructurable carrier material (1) to a substrate carrier (2), wherein the applied carrier material (1) has a layer height (H.1) and a flat surface (O.1) on an upper side opposite the substrate carrier (2), and wherein the exposure properties of the carrier material (1) can be changed by exposure to electromagnetic radiation;

—b— using information data as an input variable, wherein this information data contains information on the maximum nominal penetration depth of the selected photostructurable carrier material (1) and on a geometric shape of a three-dimensional microstructure to be embossed having an oversized structure height;

—c— performing a computer-aided modelling of a virtual three-dimensional structural model (10) of the microstructure to be embossed as a function of the information data according to step —b—, wherein the structural model (10) comprises topography data (T.10) of the microstructure to be moulded and a total height (H.10) of the structural model (10) to the microstructure to be moulded is determined on the basis of the topography data (T.10), which total height (H.10) is greater than the maximum nominal penetration depth of the electromagnetic radiation during exposure into the carrier material (1) and less than the applied layer height (H.1) of the carrier material (1);

—d— performing a computer-aided subdivision of the total height (H.10) of the three-dimensional structural model (10) into a number N (N≥2 to n) of sequentially stacked height layers, wherein each of the N (N≥2 to n) height layers corresponds to a single substructure (11, 12, 13) of the structural model (10), and wherein each one of the N (N≥2 to n) substructures (11, 12, 13) has a subheight (H.11, H.12, H.13), wherein the number N is an integer which is greater than or equal to the number 2, and wherein the number N (N≥2 to n) is selected such that each of the N (N≥2 to n) subheights (H.11, H.12, H.13) is less than or equal to a possible nominal penetration depth of the electromagnetic radiation deliverable by the exposure device when exposed into the carrier material (1), wherein the sum of the N (N≥2 to n) subheights (H.11, H.12, H.13) of the individual substructures (11, 12, 13) corresponds to the total height (H.10) of the structural model (10);

—e— calculating a virtual photomask (M.11, M.12, M.13) for each individual one of the N (N≥2 to n) substructures (11, 12, 13) of the structural model (10), wherein for each of the N (N≥2 to n) photomasks (M.11, M.12, M.13) respective topography data (T.11, T.12, T.13) of each individual substructure (11, 12, 13) is converted into corresponding values of an individual exposure dose, wherein an exposure dose calculated for a specific location (X, Y, Z) of a substructure (11, 12, 13) correlates with an individual height position (Z) of the same location (X, Y, Z) within the corresponding substructure (11, 12, 13);

—f— positioning a first virtual photomask (M.11), which corresponds to a first substructure (11) in the lowest height layer of the structural model (10), as well as alignment markings (20) on the surface (O.1) of the carrier material (1);

—g— performing an aligned exposure of the carrier material (1) using the alignment markings (20) arranged on the surface (O.1), wherein a structuring (S.11) of the first substructure (11) is written into the carrier material (1) starting from the surface (O.1) of the carrier material (1) by spatially resolved (X, Y, Z) exposure in accordance with the individual exposure dose defined in the first virtual photomask (M.11);

—h— performing a wet-chemical development (E) of the exposed portion of the carrier material (1) specified by the first virtual photomask (M.11), wherein surfaces of the structuring (S.11) of the first substructure (11) are smoothed as a function of a development rate of the carrier material (1) and of the calculated exposure dose until the surfaces of the structuring (S.11) are optically smooth (G) after exposure and development (E);

—i— obtaining a first intermediate product (21) of a partially structured carrier material, wherein the first intermediate product (21) contains the structuring (S.11) of the first substructure (11);

—j— positioning a further Nth (N≥2 to n) virtual photomask (M.12, M.13), wherein the Nth (N≥2 to n) virtual photomask (M.12, M.13) corresponds to the Nth (N≥2 to n) substructure (12, 13) in the next-higher Nth (N≥2 to n) height layer of the structural model (10) sequentially following the preceding (N−1) height layer, within the already structured structuring (S.11) of the preceding (N−1) substructure (11) of the preceding (N−1) intermediate product (21);

—k— performing an aligned further exposure of the preceding (N−1) intermediate product (21, 22, 23) on the basis of the alignment markings (20) arranged on the surface (O.1), wherein, starting from the already structured structuring (S.11) of the preceding (N−1) substructure (11), a structuring (S.12, S.13) of the Nth (N≥2 to n) substructure (12, 13) is written into the preceding (N−1) intermediate product (21) of a partially structured carrier material by spatially resolved (X, Y, Z) exposure in accordance with the individual exposure dose defined in the Nth (N≥2 to n) virtual photomask (M.12, M.13), wherein the structuring (S.12, S.13) of the Nth (N≥2 to n) substructure (12, 13) within the carrier material (1) is in each case deeper than the structuring (S.11) of the respective preceding (N−1) substructure (11);

—l— performing a wet-chemical development of the exposed portion of the carrier material (1) specified by the Nth (N≥2 to n) virtual photomask (M.12, M.13), wherein surfaces of the structuring (S.12, S.13) of the Nth (N≥2 to n) substructure (12, 13) are smoothed as a function of a development rate of the carrier material (1) and of the calculated exposure dose until the surfaces of the structuring (S.11) are optically smooth (G) after exposure and development (E);

—m— repeating a sequence of steps —j— (positioning of a further virtual photomask), —k— (further exposure) and —l— (further development) until all N (N≥2 to n) virtual photomasks (M.11, M.12, M.13) have been-structured layer by layer applied for exposure of the carrier material;

—n— obtaining a finished structured carrier material (30), wherein the finished structured carrier material (30) contains a structuring corresponding to the entire structural model (S.10) and its total height (H.10).

2. The process according to claim 1, wherein the photostructurable carrier material (1) is a positive-working photoresist in which exposed portions are released from the carrier material (1) during subsequent wet-chemical development.

3. The process according to claim 1, wherein the aligned exposure of the carrier material (1) is carried out by means of maskless laser lithography based on one-photon and/or two-photon absorption or by means of optical maskless lithography, wherein a spatial light modulator and an imaging optics are used.

4. The process according to claim 1, wherein at least one of the virtual photomasks (M.11, M.12, M.13) is positioned (20) on the surface (O.1) of the carrier material (1) that is arranged tilted at a tilt angle ($\alpha$) using the alignment markings.

5. The process according to claim 4, wherein the aligned exposure of the carrier material (1) and the subsequent wet-chemical development (E) of the exposed portion of the carrier material (1) predetermined by the at least one virtual photomask (M.11, M.12, M.13) takes place with the use of the alignment markings (20) on the surface (O.1) of the carrier material (1) that is arranged tilted at a tilt angle ($\alpha$).

6. The process according to claim 1, wherein the layer height (H.1) of the photostructurable carrier material (1) 100 µm.

7. The process according to claim 1, wherein the total height (H.10) of the structural model (10) is greater than 100 µm.

8. The process according to claim 1, wherein the number N (N≥2 to n) is selected such that each of the N (N≥2 to n) subheights (H.11, H.12, H.13) of the individual substructures (11, 12, 13) is less than or equal to the maximum nominal penetration depth.

9. The process according to claim 1, wherein the number N (N≥2 to n) is selected such that each of the N (N≥2 to n) subheights (H.11, H.12, H.13) of the individual substructures (11, 12, 13) has the same subheight, which subheight is less than or equal to the maximum nominal penetration depth.

10. The process according to claim 1, wherein the optically smooth surfaces (G) of the substructures (S.11, S.12, S.13) after exposure and development (E) have a roughness with a mean roughness value of at most 50 nm.

11. The process according to claim 6, wherein the layer height (H.1) of the photostructurable carrier material (1) is greater than 200 µm.

12. The process according to claim 6, wherein the layer height (H.1) of the photostructurable carrier material (1) is greater than 500 µm.

13. The process according to claim 6, wherein the carrier material (1) is applied to the substrate carrier (2) in multiple layers (1.1, 1.2, 1.3, 1.4).

14. The process according to claim 8, wherein the number N (N≥2 to n) is selected such that each of the N (N≥2 to n) subheights (H.11, H.12, H.13) of the individual substructures (11, 12, 13) is less than 30 µm.

15. The process according to claim 8, wherein the number N (N≥2 to n) is selected such that each of the N (N≥2 to n) subheights (H.11, H.12, H.13) of the individual substructures (11, 12, 13) is less than 20 µm.

16. The process according to claim 9, wherein the subheight is less than 30 µm.

17. The process according to claim 9, wherein the subheight is less than 20 µm.

18. The process according to claim 10, wherein the mean roughness value is at most 40 nm.

19. The process according to claim 10, wherein the mean roughness value is at most 30 nm.

* * * * *